United States Patent [19]

Pappis et al.

[11] 4,096,297
[45] Jun. 20, 1978

[54] ISOTROPIC BORON NITRIDE AND METHOD OF MAKING SAME

[75] Inventors: James Pappis, Westwood, Mass.; Lawrence M. Hagen, Reed's Ferry, N.H.; Pei-Ching Li, Northbrook, Ill.

[73] Assignee: Raytheon Company, Lexington, Mass.

[21] Appl. No.: 618,879

[22] Filed: Oct. 2, 1975

Related U.S. Application Data

[63] Continuation of Ser. No. 417,020, Nov. 19, 1973, abandoned, which is a continuation of Ser. No. 196,843, Nov. 8, 1971, abandoned, which is a continuation of Ser. No. 878,966, Dec. 4, 1969, abandoned, which is a continuation of Ser. No. 582,686, Sep. 28, 1966, abandoned.

[51] Int. Cl.² ............... C23C 11/08; C23C 11/00
[52] U.S. Cl. ............... 427/248 C; 423/290; 427/294; 428/538; 264/81
[58] Field of Search ............... 427/248 B, 248 C, 294, 427/248 C; 428/538; 423/290

[56] References Cited

U.S. PATENT DOCUMENTS

| | | | |
|---|---|---|---|
| 2,824,787 | 2/1958 | May et al. | 423/290 |
| 3,152,006 | 10/1964 | Basche | 427/248 |
| 3,351,484 | 11/1967 | Gutzeit | 427/248 |
| 3,432,330 | 3/1969 | Diefendorf | 427/248 X |
| 3,499,799 | 3/1970 | Patterson | 427/248 X |
| 3,692,566 | 9/1972 | Branovich et al. | 427/248 |

Primary Examiner—Harris A. Pitlick
Attorney, Agent, or Firm—John R. Inge; M. D. Bartlett; J. D. Pannone

[57] ABSTRACT

The invention disclosed herein relates to a body of substantially pure isotropic boron nitride in which individual anisotropic crystals of boron nitride are substantially randomly oriented and pyrolytically bonded to form a body having substantially improved electrical and mechanical properties compared with anisotropic boron nitride bodies in which individual boron nitride crystals are hot press bonded.

10 Claims, 1 Drawing Figure

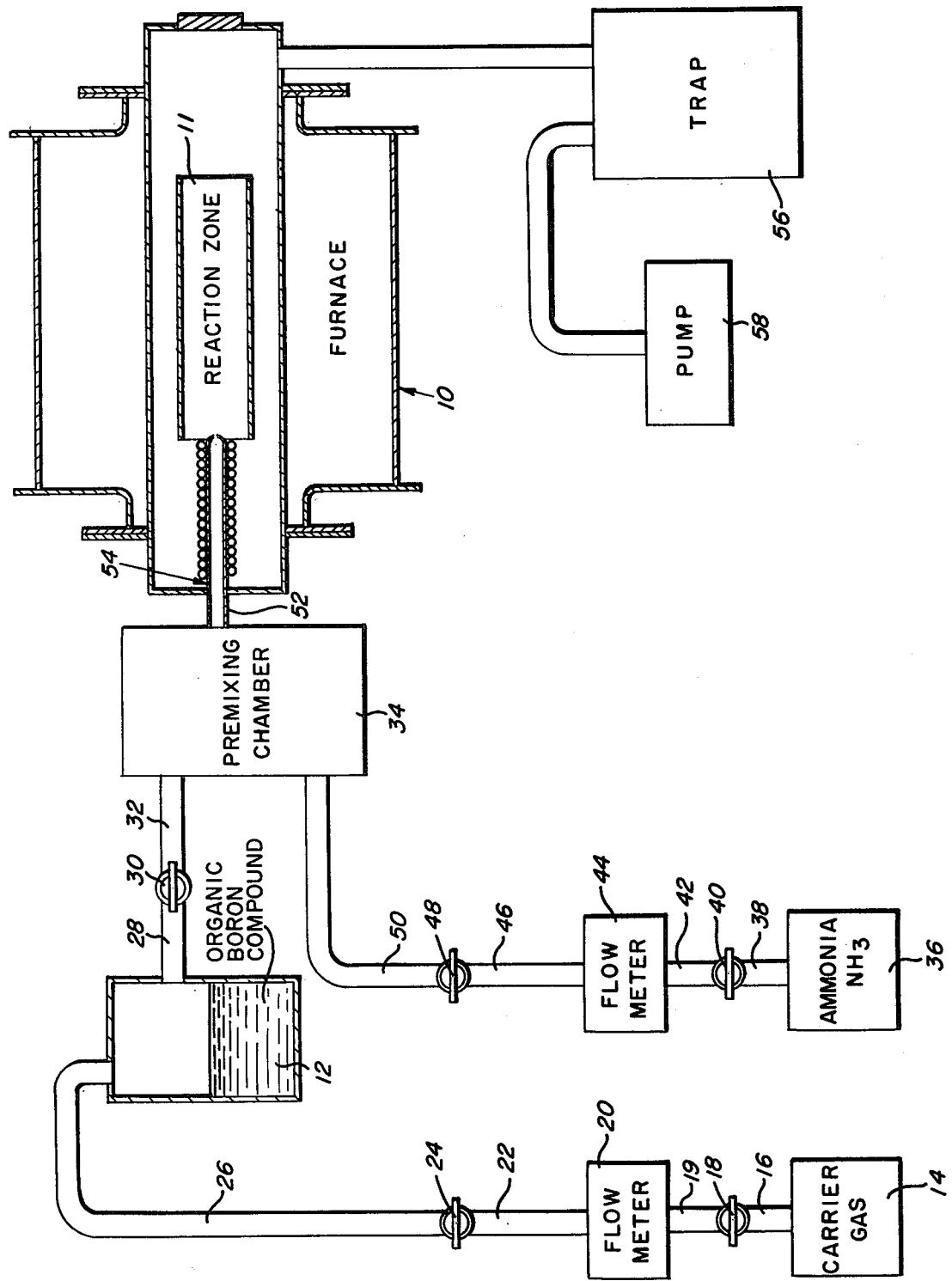

ISOTROPIC BORON NITRIDE AND METHOD OF MAKING SAME

CROSS REFERENCE TO RELATED APPLICATIONS

This is a continuation of application Ser. No. 417,020 filed Nov. 19, 1973, (now abandoned), which is a continuation of application Ser. No. 196,843 filed Nov. 8, 1971 (now abandoned), which is a continuation of application Ser. No. 878,966 filed Dec. 4, 1969 (now abandoned), which is a continuation of application Ser. No. 582,686 filed Sept. 28, 1966 (now abandoned).

Chemically vapor deposited boron nitride is a material which has been found to be extremely desirable for many uses because of its inherent properties which render it especially valuable for many electronic and structural applications such as in electron tubes, for example, as an insulating spacer, as a heat shield, or as a microwave window. Among these properties are its high thermal conductivity, its excellent electrical insulating properties even at very high temperatures, its high thermal shock resistance, and its good vacuum properties.

Boron nitride was first prepared many years ago as a powder by the reaction of boric acid with mercuric cyanide and sulphur or with potassium cyanide. However, it was generally a laboratory curiosity until recent years when it was found commercially feasible to prepare boron nitride by hot-pressing techniques with boric oxide or silica. However, such techniques with the addition of binders and fluxing agents have a deleterious effect upon the properties of the material, especially at high temperatures.

Still later, May and Levasheff disclosed, in U.S. Pat. No. 2,824,787, a new process of making boron nitride by first reacting borate esters such as methyl and ethyl borate and ammonia at temperature between 850° and 900° C and at atmospheric pressure to produce a white, finely dispersed powder which is thereafter heat treated with ammonia at a temperature between 800° and 1300° C to produce boron nitride. The product here was a brownish-colored powder.

More recently, Basche in U.S. Pat. No. 3,152,006 disclosed that he had produced a solid boron nitride coating on a suitable substrate by vapor-phase reaction between ammonia and boron trichloride at a temperature between about 1450° C and 2300° C and at a pressure below about 50 mm. of mercury. However, such coatings are anisotropic and have been found to possess nonuniform thermal conductivity, electrical resistance, and other characteristics, depending upon the direction in which measurements are taken. In planar forms specimens of substantial thicknesses often take many hours to deposit. During this time the material anneals unevenly. This annealing leads to substantial dimensional changes. if the material is restrained, delaminations and cracking frequently occur. In geometric shapes cracking and delaminations frequently occur when the thickness-to-radius ratios exceed 0.05 because of the anisotropy of the thermal expansion coefficients of the material.

Applicants have now discovered a method of producing isotropic boron nitride which possesses uniform thermal conductivity, electrical resistance, and other characteristics, which characteristics are uniform when measurements are taken in any direction, whether longitudinally, horizontally, or through the thickness dimension of a sample of the product. For example, the electrical resistivity of isotropic boron nitride ranges from about $10^{15}$ ohm cm. at 1350° C, making it one of the best high temperature insulating materials known. Furthermore, because of its isotropic characteristics it can be easily, efficiently and permanently sealed to metal, and can be readily made in large sizes and shapes and can be of practically any configuration regardless of the radius of curvature employed.

Accordingly, it is a primary object of this invention to provide isotropic boron nitride and further to provide a new and improved process wherein isotropic boron nitride is produced in desired shapes and configurations enabling the resultant product to be used for many applications requiring uniform high thermal conductivity and high electrical resistance.

This invention is achieved by the reaction of ammonia gas ($NH_3$) with an organic boron compound such as trimethyl borate [$B(OCH_3)_3$], dimethyl borinic acid, triethyl borate, trimethyl triborine trioxane or tetramethoxydiborane, or others, in a vapor deposition furnace at an elevated temperature in the range of about 1200°–2300° C at a pressure of less than about 100 torr, whereby when the gaseous reactant agents are co-mingled and then directed upon a heated substrate they will form a solid isotropic boron nitride coating on the substrate, which coating is readily removable from the substrate and possesses properties which do not vary directionally as other types of pyrolytic processes for boron nitride. It is believed that isotropic rather than anisotropic material results because of the presence of foreign atoms such as oxygen and carbon in the organic boron compound; also possibly because of the type of bonding which occurs in the organic boron compounds. As the organic molecule reacts with ammonia, the oxygen and carbon atoms inhibit crystallite alignment, and thus anisotropy, before being replaced by nitrogen to form boron nitride.

The process involved in this invention is also highly efficient and the over-all reaction, when employing trimethyl borate, may be summarized as follows:

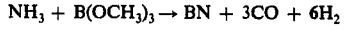

$$NH_3 + B(OCH_3)_3 \rightarrow BN + 3CO + 6H_2$$

As shown, the amount of material produced is directly proportional to the amount of each of the reactants utilized in the process, i.e., one mole of boron nitride is produced for every mole of ammonia that is reacted with one mole of trimethyl borate.

Other advantages and objectives of the invention will become more apparent from the following description taken in connection with the accompanying drawing wherein the drawing illustrates a system for use in vapor deposition of isotropic boron nitride according to this invention.

In accordance with this invention it is to be understood that there is produced boron nitride in solid homogeneous form and having true isotropic characteristics. By "homogeneous" it is meant that the boron nitride is pure to the extent that it contains substantially no traces of other constituents such as hydrogen, carbon or oxygen, or second phases such as boron oxide or silicon dioxide which are found to some extent in boron nitride as made by known prior art methods, such traces as might be found in the final product according to this invention being not more than a few parts per million. By "isotropic" it is meant that not only does the boron nitride produced by this invention have substantially uniform thermal and electrical conductivity, density and any other characteristics when measured in any direction, but the crystals thereof are not oriented, as in anisotropic boron nitride, being instead completely of random orientation.

Referring particularly to the drawing, a substrate upon which the isotropic boron nitride is to be formed is mounted in furnace 10 which is of the general type used for vapor deposition. The substrate may be of any suitable material which is able to withstand the high temperatures involved in the deposition process, such as graphite, boron nitride, refractory metals such as molybdenum, tungsten, tantalum, etc., refractory oxides such as alumina, magnesia, zirconia, etc., and may be of any desired configuration. For example, a hollow cylinder or box may be coated on its interior or exterior surfaces, or both, or a disc or other planar device may be coated, or any other substrate of practically any desired shape may be coated when suitably mounted in the furnace 10 within the reaction zone 11 thereof.

In the apparatus illustrated in the drawing, a supply is provided of the selected organic boron compound, such as trimethyl borate [$B(OCH_3)_3$], dimethyl borinic acid $(CH_3)_2BOH$, triethyl borate $(C_2H_5O)_3B$, trimethyl triborine trioxane $(CH_3)_3B_3O_3$, tetramethoxydiborane $(CH_3O)_4B_2$, or other organic boron compound of the general form $B(OR)_3$, $B_2(OR)_4$, $HB_2(OR)_3$, $H_2B_2(OR)_2$, or $B(OR)_2X$, where R is an aromatic or aliphatic hydrocarbon and X is a halogen such as chlorine, bromine or iodine. This supply is indicated in the drawing by the tank or block 12 labeled "ORGANIC BORON COMPOUND." Similarly, block 14 labeled "CARRIER GAS" indicates a supply of nitrogen, argon, or any other inert carrier gas. The carrier gas passes by way of piping 16, when valve 18 is opened, through pipe 19 into a flow meter 20 from which it flows through piping 22, valve 24 and pipe 26 into the tank 12 of organic boron compound, from which it passes through pipe 28, valve 30 and pipe 32 into a premixing chamber 34. As the carrier gas passes over the organic boron compound in tank 12 it picks up vapor from the compound, which vapor is ejected with the carrier gas into the premixing chamber 34. It will be apparent that other means may be provided for directing the vapors of the compound into the premixing chamber and that such means need not necessarily include a carrier gas. Furthermore, it will also be apparent that if the organic boron compound should be a solid, it will be necessary to provide means for heating it to its vaporization temperature.

Ammonia from supply 36 is directed through a pipe 38, valve 40 and pipe 42 into a flow meter 44 from which it flows through pipe 46, valve 48 and pipe 50 into the premixing chamber 34. Here the ammonia and inorganic boron compound gases co-mingle and then pass through pipe 52 into a water-cooled injector 54 which directs a stream of the co-mingled gases onto a substrate in the reaction zone 11 of the furnace 10. The water-cooled injector 54 is utilized to insure that the gases are maintained at a temperature below their reaction temperature.

In accordance with this invention the reaction zone of the furnace is evacuated to a pressure within the range of about 1–100 torr, preferably about 10 mm Hg, and the substrate is heated in the furnace to a temperature within the range of about 1200° to 2300° C, preferably about 1800° C. When the pressure and temperature of the furnace, or more particularly the reaction zone thereof, have stabilized, the co-mingled vapors are fed into the furnace through the water-cooled injector as described and are directed upon the substrate in the reaction zone of the furnace.

As mentioned above, the substrate upon which the isotropic boron nitride is to be formed is heated to a temperature between 1200°–2300° C and the heated substrate is subjected to the impinging flow of the co-mingled vapors, whereupon reaction occurs at the substrate surface, with the flow being directed against the substrate surface for a period of time sufficient to permit the formation of a pyrolytic deposition of isotropic boron nitride of a desired thickness. The coating may be of but a few tenths of a mil in thickness or, alternatively, it may be of a significant fraction of an inch, or even more. Where the deposit is thin, it will normally be left in position on the substrate, while thicker coatings may be separated from the substrates, resulting in the production of free-standing or self-supporting bodies of isotropic boron nitride. As is evident, the present invention is not limited to a particular thickness or shape for the deposition made by the method disclosed herein, and the thickness or shape of a particular body produced by this method will, of course, depend upon the mechanical or other requirements of the particular use to which the body is to be put.

With the initial temperature of the feed gases being established at a level substantially below the temperature of pyrolytic decomposition thereof, the co-mingled gases are preferably fed into the furnace by suitable jet-forming means so as to concentrate the stream of gases against the heated surface of the substrate upon which the pyrolytic deposition is made. A primary purpose for initially establishing the temperature of the feed gases at the aforementioned low level is to minimize any pyrolysis or reaction at areas other than on the substrate surface, such as at the exits of the gas injector or elsewhere in the approach zone to the hot deposition surface. it is desired that the pyrolytic reaction take place only at the hot surface of the substrate or immediately adjacent thereto, and it is believed that the gases so reach this surface simultaneously.

The aforementioned pyrolysis is continued for a time period sufficient to form a deposition of a desired thickness. It will be understood that this thickness will depend upon, in addition to the duration of the pyrolytic action, the rate of flow of the feed gases, the temperature of the reaction zone and of the substrate surface, the nature of the atmosphere in which the pyrolysis takes place, and other operating conditions which may be varied or controlled to achieve different desired characteristics in the finished product. The overall decomposition rate is also dependent upon the individual amounts of each of the gaseous reactants introduced into the furnace, as well as the furnace pressure. A deposition rate of maximum utility is about 20 mils per hour.

Unreacted gases and gaseous reaction products are removed from the furnace by a cold trap 56 and a mechanical pump 58. After completion of the pyrolysis, the gaseous reactants are shut off and the temperature of the system is allowed to return to room temperature and the substrate having the isotropic boron nitride coating is ready to be utilized. The coating, either upon the substrate or removed therefrom as a self-supporting product, may be machined or otherwise worked upon in order to produce objects having shapes other than that of the substrate employed.

Numerous procedures utilizing a wide range of process conditions have been carried out. The deposition temperature may be varied between about 1200° and 2300° C, the furnace pressure may range about from 1 to 100 torr, the ammonia gas flow rate may vary about from 1 to 40 mols per hour, the carrier gas flow rate may range from about 0 to 40 mols per hour, and the organic boron compound may range about from 0.1 to 6 mols per hour. Preferred conditions for three different geometries are found in Table A, as follows:

TABLE A

| Deposition Temperature | 1700° C | 1750° C | 1650° C |
|---|---|---|---|
| Furnace Pressure | 10 mm Hg | 8 mm Hg | 10 mm Hg |
| Ammonia Flow Rate | 3.06 mols/hr. | 8.16 mols/hr. | 15.3 mols/hr. |
| Carrier Gas Flow Rate | 3.06 mols/hr. | 8.16 mols/hr. | 15.3 mols/hr. |
| $B(OCH_3)_3$ Flow Rate | 0.28 mol/hr. | 0.74 mol/hr. | 1.4 mols/hr. |

Table B which follows sets forth an example of conditions wherein triethyl borate was the organic boron compound used:

TABLE B

| Deposition Temperature | 1750° C |
|---|---|
| Furnace Pressure | 8 mm Hg |
| Ammonia Flow Rate | 8.16 mols/hr. |
| Carrier Gas Flow Rate | 4.08 mols/hr. |
| $(C_2H_6O)_3B$ Flow Rate | 0.74 mol/hr. |

Table C which follows sets forth one example of conditions wherein tetramethoxydiborane was used as the organic boron compound:

TABLE C

| Deposition Temperature | 1700° C |
|---|---|
| Furnace Pressure | 8 mm Hg |
| Ammonia Flow Rate | 9.18 mols/hr. |
| Carrier Gas Flow Rate | 3.06 mols/hr. |
| $(CH_3O)_4B_2$ Flow Rate | 0.56 mol/hr. |

Under the conditions set forth in the foregoing Tables, coatings of isotropic boron nitride were obtained having properties as set forth in the following Table D or within the ranges set forth therein:

TABLE D

| Density | 1.20 – 1.60 gm/cc |
|---|---|
| Purity | 99 + per cent |
| Porosity | None |
| Thermal Expansion Coefficient in/in/° C $\times 10^{-6}$ | 3.80 – 4.12 |
| Thermal Conductivity at 200° C (cgs units) | 0.2 – 0.8 |
| Electrical Resistivity | |
| ohm-cm at RT | $10^1$ |
| at 1000° C | $10^8$ |
| Dielectric Constant at 5.75 $\times 10^9$ cps | |
| RT | 3.01 – 3.36 |
| 400° C | 3.01 – 3.38 |
| 1000° C | 3.01 – 3.42 |
| 1500° C | 3.01 – 3.47 |
| Loss Tangent at 5.75 $\times 10^9$ cps | |
| RT | 0.00050 |
| 400° C | 0.00015 |
| 1000° C | 0.00005 |
| 1500° C | 0.00040 |
| Flexural Strength | |
| RT | 10.0–16.4 $\times 10^3$ psi |
| 1000° C | 11 – 17 $\times 10^3$ psi |
| 2000° C | 16.7–22.1 $\times 10^3$ psi |
| Elastic Modulus | 1.76–3.8 $\times 10^6$ psi |
| Poisson's Ratio | 0.20–0.23 |

The boron nitride products resulting from the foregoig processes are completely homogenous and isotropic and are found to possess the characteristics desired in accordance with the objectives of this invention.

It is to be understood that various modificatons and changes may be made in the processes set forth herein by those skilled in the art without departing from the spirit of this invention as set forth in the appended claims.

We claim:

1. The method of forming a solid body of substantially isotropic boron nitride comprising vapor deposition of boron nitride upon a substrate resulting from the reaction of ammonia and an organic boron compound at a temperature in the range of 1200°–2300° C and a pressure of less than about 100 torr, said organic boron compound being selected from the group consisting of dimethyl boronic acid, trimethyl triborine trioxane, and compounds of the form $B(OR)_3$, $B_2(OR)_4$, $HB_2(OR)_3$, $H_2B_2(OR)_2$, or $B(OR)_2X$, where R is an aromatic or aliphatic hydrocarbon and X is a halogen.

2. The method according to claim 1 wherein said step of forming said solid body of boron nitride comprises vapor deposition of boron nitride crystals producing substantial random orientation of said crystals.

3. The method according to claim 1 wherein said vapor deposition comprises:
   co-mingling vapors of ammonia and said organic boron compound; and
   directing the co-mingled vapors onto said substrate.

4. The method according to claim 3 wherein said substrate is heated to said temperature range of 1200°–2300° C.

5. The method according to claim 1 wherein said organic boron compound is selected from the group consisting of trimethyl borate, dimethyl borinic acid, triethyl borate, trimethyl triborine trioxane, and tetramethoxydiborane.

6. The method of forming a solid body of substantially isotropic boron nitride comprising vapor deposition of boron nitride crystals on a substrate with a random orientation of said crystals, said deposition resulting from the reaction of ammonia and an organic boron compound at a temperature in the range of 1200°–2300° C and a pressure of less than about 100 torr, said organic boron compound being selected from the group consisting of dimethyl borinic acid, trimethyl triborine trioxane, and compounds of the form $B(OR)_3$, $B_2(OR)_4$, $HB_2(OR)_3$, $H_2B_2(OR)_2$, or $B(OR)_2X$, where R is an aromatic or aliphatic hydrocarbon and X is a halogen.

7. The method according to claim 6 wherein said vapor deposition comprises pyrolytic reaction at the surface of said substrate.

8. The method according to claim 6 wherein said vapor deposition comprises:
   co-mingling vapors of ammonia and said organic boron compound; and
   directing the co-mingled vapors onto said substrate.

9. The method according to claim 8 wherein said substrate is heated to said temperature range of 1200°–2300° C.

10. The method according to claim 6 wherein said organic boron compound is selected from the group consisting of trimethyl borate, dimethyl borinic acid, triethyl borate, trimethyl triborine trioxane, and tetramethoxydiborane.

* * * * *

UNITED STATES PATENT OFFICE
CERTIFICATE OF CORRECTION

Patent No. 4,096,297    Dated Jun. 20, 1978

Inventor(s) James Pappis, Lawrence M. Hagen, Pei-Ching Li

It is certified that error appears in the above-identified patent and that said Letters Patent are hereby corrected as shown below:

In the Specification

Column 1, line 58: delete "if" insert - If - ;

Column 2, line 3: after "at" insert - room temperature to about $10^6$ ohms cm at -;

Column 5, line 30; in Table B delete "$(C_2H_6O)_3$" insert - $(C_2H_5O)_3$ - ;

line 53: in Table D delete "$10^1$" insert - $10^{15}$-;

line 60: delete "0.00050" insert - 0.00030 - ;

line 63: delete "10.0" insert - 10.9 - ;

line 66: delete "3.8" insert - 3.2 - ;

Signed and Sealed this

Twenty-eighth Day of November 1978

[SEAL]

Attest:

RUTH C. MASON
Attesting Officer

DONALD W. BANNER
Commissioner of Patents and Trademarks